United States Patent [19]

Hargasser et al.

[11] Patent Number: 4,864,471
[45] Date of Patent: Sep. 5, 1989

[54] COMPONENT FOR SURFACE MOUNTING AND METHOD FOR FASTENING A COMPONENT FOR SURFACE MOUNTING

[75] Inventors: Hans Hargasser; Joachim Dathe, both of Munich, Fed. Rep. of Germany

[73] Assignee: Siemens Aktiengesellschaft, Berlin and Munich, Fed. Rep. of Germany

[21] Appl. No.: 904,636

[22] Filed: Sep. 8, 1986

[30] Foreign Application Priority Data

Sep. 30, 1985 [DE] Fed. Rep. of Germany ....... 3534872

[51] Int. Cl.$^4$ .............................................. H05K 7/06
[52] U.S. Cl. ............................. 361/417; 29/DIG. 39; 29/832; 361/400; 361/402; 361/419
[58] Field of Search .......... 357/80; 361/387, 400–402, 361/417–420; 29/832, 849, DIG. 39

[56] References Cited

U.S. PATENT DOCUMENTS 4,567,546 1/1986 Zeller et al. ........................ 361/417

FOREIGN PATENT DOCUMENTS

| 2736090 | 2/1978 | Fed. Rep. of Germany . |
| 3231277 | 2/1984 | Fed. Rep. of Germany . |
| 2502387 | 9/1982 | France . |
| 0053448 | 4/1980 | Japan .................................. 357/80 |
| 57-68053 | 4/1982 | Japan . |
| 59-9310 | 1/1984 | Japan . |
| 0215759 | 12/1984 | Japan .................................. 357/80 |
| WO85/01634 | 4/1985 | PCT Int'l Appl. . |
| 2025804 | 1/1980 | United Kingdom . |
| 1335159 | 10/1983 | United Kingdom . |

Primary Examiner—Gregory D. Thompson
Attorney, Agent, or Firm—Hill, Van Santen, Steadman & Simpson

[57] ABSTRACT

A component for surface mounting is fixed by means of adhesive to a surface of a member. For improving the adhesion, the fixable surface of the component includes a structure which makes it possible, first, for this fixable surface to lie flush against the surface of the member. Second, the structure of the fixable surface also makes it possible for a quantity of adhesive adequate for fixing to remain between the fixable surface of the component and the surface of the member.

9 Claims, 1 Drawing Sheet

COMPONENT FOR SURFACE MOUNTING AND METHOD FOR FASTENING A COMPONENT FOR SURFACE MOUNTING

BACKGROUND OF THE INVENTION

1. Field of the Invention

The present invention relates to a component for surface mounting having a surface position to be fixed by adhesive to the surface of another member and to a method for fastening a component for surface mounting with an adhesive.

2. Description of the Prior Art

Components for surface mounting known under the designation SMD (surface mounted device) have been used for several years for hybridization of film circuits. Together with the shift from manual equipping to automatic equipping, the mass employment of SMD components produces a significant boost in economic feasibility. Since an extensive program of components and automatic equipping units is now present, more and more users are switching to the introduction of this formating technology for printed circuit boards as well.

Components for surface mounting are usually taken from a conveying belt, i.e. from a plastic cavity, and are positioned and glued on the surface of another member, for example a printed circuit board. Subsequently, the other member is turned over and, for soldering the component terminals, is dipped into a tin bath or into a solder bath.

A fast and reliable fastening of the components to the other member is acheived from the time the components are positioned until the end of the soldering procedure, i.e. until the solder locations have solidified.

FIG. 1 of the drawings shows how the technological problem thereby occuring has hitherto been resolved. In accordance with the prior art, the following conditions must be observed for reliable gluing of a component for surface mounting:

1. An adhesive compound 3 must be positioned under a housing 1 of the SMD component.

2. The quantity of the adhesive 3 sprayed on must be metered such that, first, the housing 1 of the SMD component and the surface of another member 4 to which the SMD component is to be secured are adequately covered in order to achieve the necessary adhesion of the SMD component and such that, second, the adhesive compound 3 does not cover the solder surfaces of component terminals 2 of the SMD component.

The spacing of the housing 1 of the SMD component from the surface of the other member 4 on which the SMD component is to be secured dare not become excessively large as a consequence of the manufacturing tolerances which unavoidably occur when bending the terminal legs 2 of the SMD component. For example, the spacing of the housing 1 of the SMD component from the surface of the other member 4 on which the SMD component is to be secured amounts to 0.05+0.05 mm.

The overall method for fastening SMD components in accordance with the prior art is very involved so that a reliable adhesion of a SMD component is achieved given a component and given a method of the prior art. The positioning of the adhesive compound 3 under the housing 1 of the SMD component of the prior art requires a relatively great outlay. In accord with the prior art, the adhesive compound 3 must be sprayed on and, as it is sprayed, must also be dosed within relatively narrow tolerances.

The manufacturing tolerances which are unavoidable when bending the terminal legs 2 of the SMD component influence the spacing of the housing 1 from the surface of the other member 4 on which the SMD component is to be fastened. Given a component and given a method of the prior art, the spacing of the housing 1 of the SMD component from the surface of the other member 4 on which the SMD component is to be fixed can only be precisely specified up to these manufacturing tolerances of the terminal legs 2 of the SMD component. Due to this tolerance in the spacing of the housing 1 from the surface of the other member 4, the dosing of the adhesive compound 3 is to come within certain tolerances. This dosing of the adhesive compound 3, namely, depends on the spacing of the housing 1 from the surface of the other member 4 on which the SMD component is to be secured.

When, as a consequence of manufacturing tolerances in the bending of the terminal legs 2 of the SMD component, the spacing of the housing 1 from the surface of the other member 4 on which the SMD component is to be fixed ends up being especially large, it can occur that the dosing of the adhesive compound 3 no longer adequately covers the housing 1 and the surface of the other member 4 to guarantee the required adhesion of the SMD component to the other member 4. When, on the other hand, the spacing of the housing 1 from the surface of the other member 4 is dimensioned very small from the very outset, then for a prescribed dosed quantity of adhesive compound 3 and for some SMD components the surfaces of the terminal legs 2 become covered with adhesive compound 3. As a result, faultless solder locations are no longer possible.

SUMMARY OF THE INVENTION

An object of the present invention is to provide good adhesion between a surface mounted device and the element to which it is mounted and to ensure fault free solder connections at the terminals at a reduced cost.

This object and other objects is inventively achieved by a component for surface mounting that includes a structure to enable the fixable surface of the component to lie on the surface to which it is attached yet enable a quantity of adhesive to remain therebetween. A method for fastening a component for surface mounting is also provided according to the present invention including applying a quantity of adhesive to the surface to which the component is attached and applying the component flush against the surface so that adhesive remains therebetween.

For fastening the housing of the SMD component having arbitrary dimensions and an arbitrary number of terminal legs to the surface of another member, the fixable surface of the housing of the SMD component is structured so that it can fully rest on the surface of the other member. Secondly, an adequate quantity of adhesive still remains between the housing of the SMD component and the surface of the other member. This structuring of the fixable surface of the SMD component can, for example, ensue by means of forming furrows or by roughening or by forming cavities, particularly flat cavities, in the fixable surface.

Forming these structures on the fixable surface of a SMD component has the advantage that the deformations in the housing do not render more difficult the manufacture of the housing of the SMD component.

This advantage plays a particular part when the housing of the SMD component is composed of plastic, of ceramic or of some other material which is shaped in a casting mold or an injection mold and which must be finally removed from this mold.

The application of the invention is of particular advantage when the structure on the fixable surface of the SMD component is generated such that excess adhesive is not expressed at locations of the SMD component at which electrical terminals of the SMD component are situated. The advantage is also realized when that location on the surface of the other member on which the SMD component is positioned is arranged such that excess adhesive is pressed out at locations which have no disadvantageous consequences for the function of the other member with respect to the surface of the other member as well.

The other member, here, is generally a printed circuit board on which a SMD component is fastened.

Advantageously, the invention makes it possible to provide the fixable surface of the SMD component with an adhesive before fastening the SMD component to the surface of the other member. An adhesive that produces a firmly adhering connection between the housing of the SMD component and the surface of another member on which the SMD component is to be fixed is used. The adhesive produces such connection given a slight contact pressure and/or given the application of a solvent. It is preferrable in one embodiment that the component manufacturer apply an adhesive or an adhesive film to the fixable surface of the SMD component. Further, adhesive can already be applied to the fixable surface of the component before binding of the SMD component.

Alternately, or in addition thereto, the invention enables the adhesive to be applied surface-like to the surface of another member to which the SMD component is to be fixed. Such an adhesive can be applied to the surface of the other member by spraying, with the assistance of one or more masks, and/or by means of a printing method and/or in the form of adhesive films. The application of the adhesive can thereby ensue immediately before the component mounting onto the surface of the other member or can already have taken place during the manufacture of the other member. The adhesive effect of the adhesive on the surface of the other member to which the SMD component is to be fixed can be activated, for example, by contact pressure and/or by temperature and/or by solvent.

The invention can be employed in all SMD components, however, the invention is particularly advanageous given SOT components, for example given the formats SOT-23 and SOT-143.

DESCRIPTION OF THE PREFERRED EMBODIMENTS

Figure 1:
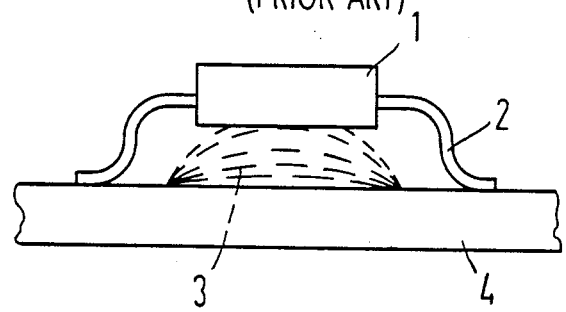
FIG. 1 is a side elevation of a component for surface mounting in accordance with the prior art.
Figure 2:
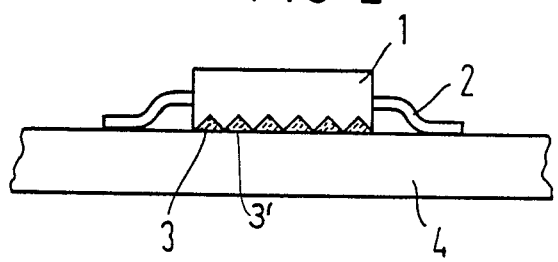
FIG. 2 is a side elevation of a component for surface mounting in accordance with the principles of the present invention.
Figure 3:
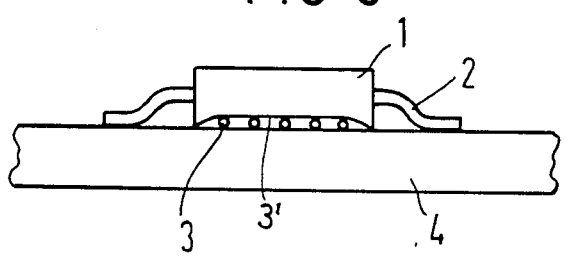
FIG. 3 is a side elevation of another embodiment of the present surface mountable component.

FIGS. 2 and 3 each show a component for surface mounting having a housing 1 and terminal legs 2, the component being secured to a printed circuit board 4 by means of an adhesive compound 3. That side of the housing 1 of the SMD component with which the SMD component is secured to the printed circuit board 4 thereby respectively comprises a special structure.

In FIG. 2, the side of the SMD component secured to the printed circuit board includes furrows or channels or grooves. These furrows or channels or grooves are formed such that, first, the housing 1 can lie flush against the printed circuit board 4; such that, second, an adequate quantity of adhesive 3 still remains between the housing 1 and the printed circuit board 4; and such that excess adhesive is expressed at locations at which there is no risk that a terminal leg 2 or a location on the printed circuit board 4 to be soldered is covered with adhesive compound.

The housing 1 of FIG. 3 includes a flat cavity which likewise makes it possible for the housing 1 in FIG. 3, first, to lie flush and, second, for an adequate quantity of adhesive to remain between housing 1 and printed circuit board 4 and, further, for excess adhesive to be expressed at locations where there is no risk that a terminal leg 2 or a solder location on the printed circuit board 4 will be covered with adhesive compound.

The surface mounting technique for circuit components provides a cost reduction over other techniques. Additional cost savings are provided by the present invention. The invention enables a greater independence in fastening a SMD component to the surface of another member, namely a greater independence from manufacturing tolerances in the bending of the terminal legs.

The invention enables a greater flexibility in the application of SMD components. The adhesive compound is either applied to that side of the SMD component to be fixed and/or to the surface of the other member on which the SMD component is to be fixed, the adhesive application taking place before the mounting of the components. Significantly less care need be exercised regarding tolerances in the dosing of the adhesive compound than is required in the prior art. This provides advantages in the dimensions of the SMD component as well.

SMD components are advantageously supplied in belt bands. Automatic equipping machines to which SMD components are supplied in belt bands function in a particulary cost-beneficial way.

The invention enables a more flexible, more reliable, faster and more cost-favorable surface mounting than was possible based on the prior art.

The invention can be applied to hybrid circuits, to film circuit structures, to printed circuit boards such as motherboards, etc. Multi-component adhesives are also possible for use as the adhesive. The adhesive components are distributed onto the fixable side of the SMD component and onto the surface of the other member on which the component is to be secured, being distributed in the form of adhesive films.

Provided the SMD components are applied to a substrate, for example to a printed circuit mother board, the SMD components can fall off again when the adhesive which must be applied to the substrate had been applied to the substrate a relatively long time ago and has therefore easily dried out or hardened and therefor no longer exhibits very much adhesion. When, however, the SMD component has a cavity 3', an adhesive or an adhesive component is timely applied such that the adhesive develops an adequate adhesive force overall at the time the SMD component is applied to the substrate. The adhesive or the adhesive components can, at the same time, be spatially locally applied precisely to those locations at which adhesive force must be developed for a reliable fastening of the SMD component without having the applied adhesive or the applied adhesive components slipping or bleeding or dripping and, thus, finally, being situated at locations where adhesive compound is undesired.

The cavity 3' is a well-suited form for reliably accepting an adequate quantity of adhesive at such a point in time that the SMD component, finally, can be reliably secured to the substrate. The cavity 3' is preferred when a two-component adhesive is employed, whereby one adhesive component is accomodated in the cavity 3' so that, as a consequence of the cavity, an adequate quantity of the adhesive can be accomodated overall in its own separate space to achieve a good adhesive action. A suitable spacing between the terminal legs 2 and the substrate on printed circuit mother board 4 is defined by the low end of the housing 1 at the edge of the cavity 3', so that an optimum electrical contacting of the SMD component can be achieved simultaneously with optimum adhesive force of the adhesive.

The low point of the housing 1 at the edge of the housing 1 can also be achieved when each of the portions of the edge of the cavity 3' does not rest on the substrate or printed circuit mother board.

As is apparent from the foregoing specification, the invention is susceptible of being embodied with various alterations and modifications which may differ particularly from those that have been described in the preceeding specification and description. It should be understood that we wish to embody within the scope of the patent warranted hereon all such modifications as reasonably and properly come within the scope of our contribution to the art.

We claim as our invention:

1. A component for surface mounting on a member, the component having a housing of arbitrary dimensions and having an arbitrary number of legs, comprising in combination:
    a member having a surface;
    a component having a component housing;
    an adhesive compound between said surface and said component housing;
    a fixable surface on said component housing fixed with said adhesive to said surface of said member, said fixable surface of said component housing including a single cavity and including portions of said fixable surface lying flush on said surface of said member, said single cavity of said flexible surface enabling a quantity of said adhesive adequate for fixing said component housing to said member to remain between said fixable surface of said component housing and said surface of said member.

2. A component as claimed in claim 1, wherein said adhesive compound is provided on said flexible surface of said component housing before said component housing is fixed to said surface of said member, said single cavity of said fixable surface accepting said adhesive compound so that said portions of said fixable surface lie flush on said surface of said member.

3. A component as claimed in claim 1, further comprising: an adhesive film employed as said adhesive.

4. A component as claimed in claim 1, further comprising: a two component adhesive employed as said adhesive.

5. A component for surface mounting on a surface of a member, comprising in combination:
    a member having a surface on which a component is to be mounted;
    a component including means for establishing a defined position of said component relative to said surface of said member, said means including a fixable surface of said component, with portions of said fixable surface resting on said surface of said member to establish said defined position, said portions defining a single cavity therebetween; and
    an adhesive between said component and said surface of said member, said adhesive being in said single cavity.

6. A method for fastening a component for surface mounting, the component having arbitrary dimensions and having an arbitrary number of terminal legs, fixable surface of the component for fixing to a surface of a member by means of an adhesive, wherein the fixable surface of said component is structured such for improving adhesion, comprising: planarly applying a quantity of adhesive to the surface of the member; placing portions of the fixable surface of the component flush on the surface of the member; and enabling a quantity of adhesive adequate for fixing to remain between the fixable surface of the component and the surface of the member in a single cavity in said fixable surface.

7. A method as claimed in claim 6, wherein a quantity of the adhesive is applied by spraying to the surface of said member.

8. A method as claimed in claim 6, wherein a quantity of the adhesive is applied to the surface of said member by printing.

9. A method as claimed in claim 6, wherein a quantity of the adhesive is applied in the form of an adhesive film.

* * * * *

UNITED STATES PATENT AND TRADEMARK OFFICE
CERTIFICATE OF CORRECTION

PATENT NO. : 4,864,471
DATED : September 5, 1989
INVENTOR(S) : Hans Hargasser et al It is certified that error appears in the above—identified patent and that said Letters Patent is hereby corrected as shown below:

On the title page

Change the application No. from "904,636" to --904,638--.

Signed and Sealed this

Twenty-fifth Day of September, 1990

Attest:

HARRY F. MANBECK, JR.

*Attesting Officer*  *Commissioner of Patents and Trademarks*